(12) United States Patent
Suzuki et al.

(10) Patent No.: US 11,881,677 B2
(45) Date of Patent: Jan. 23, 2024

(54) LASER LIGHT SOURCE

(71) Applicants: DENSO CORPORATION, Kariya (JP); TOHOKU UNIVERSITY, Sendai (JP); Waseda University, Tokyo (JP)

(72) Inventors: Taku Suzuki, Kariya (JP); Masashige Sato, Kariya (JP); Hiroshi Yasaka, Sendai (JP); Nobuhide Yokota, Sendai (JP); Tomohiro Kita, Tokyo (JP)

(73) Assignees: DENSO CORPORATION, Kariya (JP); TOHOKU UNIVERSITY, Sendai (JP); WASEDA UNIVERSITY, Tokyo (JP)

(*) Notice: Subject to any disclaimer, the term of this patent is extended or adjusted under 35 U.S.C. 154(b) by 336 days.

(21) Appl. No.: 17/198,745

(22) Filed: Mar. 11, 2021

(65) Prior Publication Data

US 2021/0288461 A1 Sep. 16, 2021

(30) Foreign Application Priority Data

Mar. 16, 2020 (JP) ................. 2020-045196

(51) Int. Cl.
*H01S 3/083* (2006.01)
*H01S 3/13* (2006.01)
(Continued)

(52) U.S. Cl.
CPC ............ *H01S 3/1305* (2013.01); *H01S 3/083* (2013.01); *H01S 3/0813* (2013.01); *H01S 3/137* (2013.01); *H01S 3/1307* (2013.01)

(58) Field of Classification Search
CPC ...... H01S 3/1305; H01S 3/0813; H01S 3/083; H01S 3/1307; H01S 3/137;
(Continued)

(56) References Cited

U.S. PATENT DOCUMENTS

2006/0198415 A1* 9/2006 Yamazaki ............. G02F 1/0147
372/67
2008/0056311 A1* 3/2008 Takeuchi ................ H01S 5/141
372/20
(Continued)

FOREIGN PATENT DOCUMENTS

JP 2012-114163 A 6/2012
JP 2017-147299 A 8/2017

OTHER PUBLICATIONS

Tin Komljenovic and John E. Bowers, "Monolithically Integrated High-Q Ringsfor Narrow Linewidth Widely Tunable Lasers", IEEE Journal of Quantum Electronics, vol. 51, No. 11, 0600610 (2015).

*Primary Examiner* — Xinning(Tom) Niu
(74) *Attorney, Agent, or Firm* — POSZ LAW GROUP, PLC (57) ABSTRACT

A laser light source includes: a resonance unit with a light emitter; and an optical negative feedback unit. The resonance unit includes: a first waveguide; a first reflector to input the reflected light to the first waveguide; a second waveguide; a second reflector connected to the second waveguide; and a ring resonator between the first waveguide and the second waveguide. The light from the first reflector is blocked from the ring resonator and partially transmitted to a first end of the first waveguide opposite to a second end connected to the light emitter and the first reflector. The optical negative feedback unit includes: a third waveguide to which the light transmitted to the first end of the first waveguide is inputted; and a third reflector connected to the third waveguide. The light from the third reflector is inputted to the first waveguide via the third waveguide.

17 Claims, 8 Drawing Sheets

(51) Int. Cl.
*H01S 3/081* (2006.01)
*H01S 3/137* (2006.01)

(58) Field of Classification Search
CPC .. H01S 3/08027; H01S 3/08031; H01S 3/106; H01S 5/021; H01S 5/142
See application file for complete search history.

(56) References Cited

U.S. PATENT DOCUMENTS

| | | | | |
|---|---|---|---|---|
| 2008/0259437 | A1* | 10/2008 | Suzuki | H01S 5/1032 |
| | | | | 359/326 |
| 2009/0122817 | A1* | 5/2009 | Sato | G02B 6/12007 |
| | | | | 372/20 |
| 2010/0284649 | A1 | 11/2010 | Ishii | |
| 2014/0126601 | A1* | 5/2014 | Jeong | G02B 6/26 |
| | | | | 385/50 |
| 2015/0288148 | A1* | 10/2015 | Takabayashi | H01S 3/06791 |
| | | | | 372/6 |
| 2016/0156149 | A1* | 6/2016 | Takabayashi | H01S 5/142 |
| | | | | 372/6 |

\* cited by examiner

FIG. 7
COMPARATIVE

LASER LIGHT SOURCE

CROSS REFERENCE TO RELATED APPLICATION

The present application is based on Japanese Patent Application No. 2020-045196 filed on Mar. 16, 2020, the disclosure of which is incorporated herein by reference.

TECHNICAL FIELD

The present disclosure relates to a laser light source using optical negative feedback.

BACKGROUND

There are proposed various methods for narrowing the spectral line (i.e., narrowing the spectral line width) of a laser light source. For example, in a laser light source having an external resonator structure that provides a resonator outside the light emitter, a method of narrowing the line by extending the length of the resonator has been proposed. However, if the length of the resonator is extended, it becomes difficult to adjust the oscillation frequency as the line is narrowed, and the frequency modulation range becomes narrow. Further, a method has been proposed in which the phase of the outputted light is adjusted by an electric feedback technique to cancel the fluctuation and lower the line width coefficient to narrow the line. However, the effect of narrowing the line is limited only by lowering the line width coefficient.

On the other hand, in a laser light source using optical negative feedback that cancels fluctuations with light, it is possible to extend the length of the resonator and reduce the line width coefficient. This configuration can provide an effect of narrowing the line that is greater than that of the above laser light source. For example, there is proposed a laser light source that includes a gain medium that generates light, a resonator placed outside the gain medium, two reflectors located at both ends of the path through the gain medium and resonator, and an optical negative feedback unit connected to one of the reflectors.

SUMMARY

According to an example of the present disclosure, a laser light source is provided to include: a resonance unit with a light emitter; and an optical negative feedback unit. The resonance unit includes: a first waveguide; a first reflector to input the reflected light to the first waveguide; a second waveguide; a second reflector connected to the second waveguide; and a ring resonator between the first waveguide and the second waveguide. The light from the first reflector is blocked from the ring resonator and partially transmitted to a first end of the first waveguide opposite to a second end connected to the light emitter and the first reflector. The optical negative feedback unit includes: a third waveguide to which the light transmitted to the first end of the first waveguide is inputted; and a third reflector connected to the third waveguide. The light from the third reflector is inputted to the first waveguide via the third waveguide.

BRIEF DESCRIPTION OF DRAWINGS

The objects, features, and advantages of the present disclosure will become more apparent from the following detailed description made with reference to the accompanying drawings. In the drawings.

DETAILED DESCRIPTION

Hereinafter, embodiments of the present disclosure will be described with reference to the drawings. In the following embodiments, the same reference signs are assigned to parts that are the same or equivalent to each other to describe the same.

First Embodiment

Figure 1:
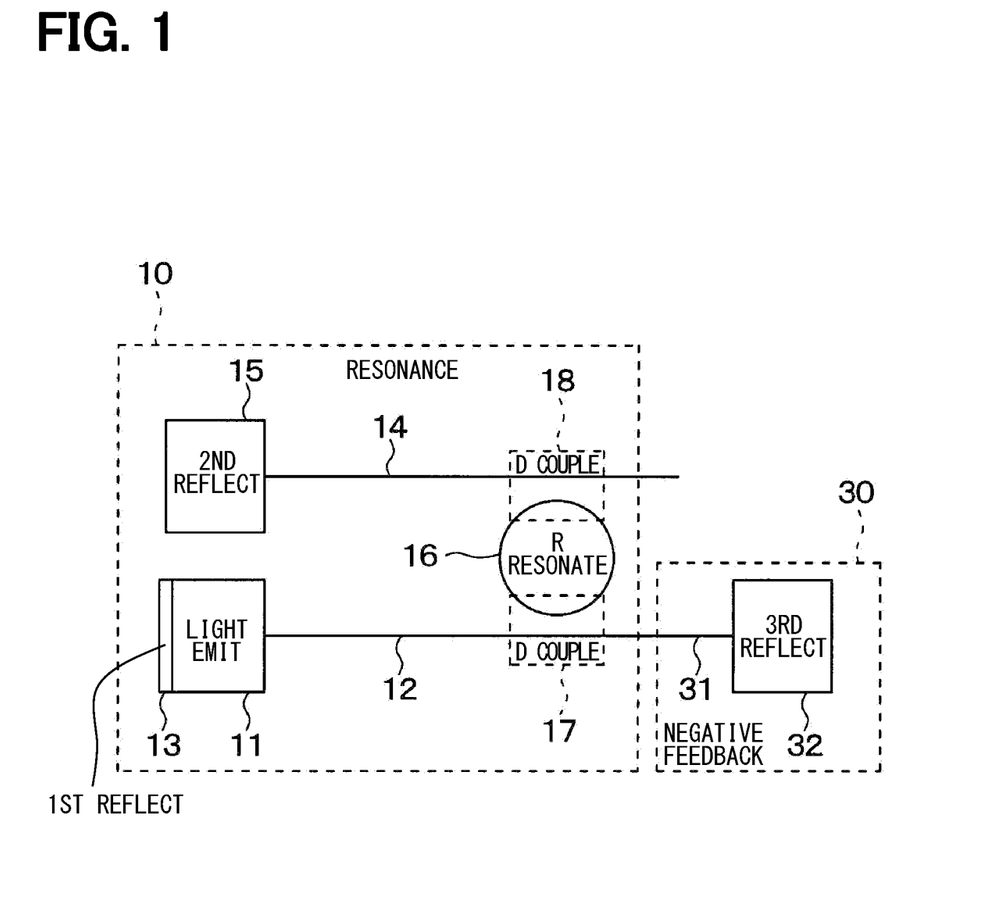
FIG. 1 is a diagram showing a configuration of a laser light source according to a first embodiment.

The following describes a first embodiment. A laser light source, which may also be referred to as a laser light source apparatus, according to the present embodiment is a laser light source using optical negative feedback (which may also be referred to as light negative feedback). As shown in FIG. 1, the laser light source includes (i) a resonance unit 10, to resonate and output light, and (ii) an optical negative feedback unit 30, to control the frequency of the light outputted from the resonance unit 10. The resonance unit 10 and the optical negative feedback unit 30 are composed of an optical integrated circuit formed on an SOI (Silicon on Insulator) substrate by silicon photonics. It is noted that the resonance unit 10 may also be referred to as a resonance circuit 10; the optical negative feedback unit 30 may also be referred to as an optical negative feedback circuit 30.

The resonance unit 10 includes a light emitter 11 that is a gain medium for emitting light. The light emitter 11, which is composed of, for example, a semiconductor optical amplifier, is configured to operate in response to an electric signal input from an external control circuit (not shown). The resonance unit 10 is configured as an external resonator that resonates and outputs the light emitted by the light emitter 11 by using a resonator arranged outside the light emitter 11.

Figure 2:
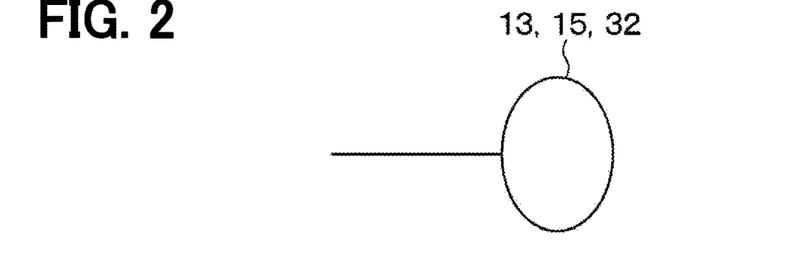
FIG. 2 is a diagram showing a configuration of a reflector.
Figure 3:
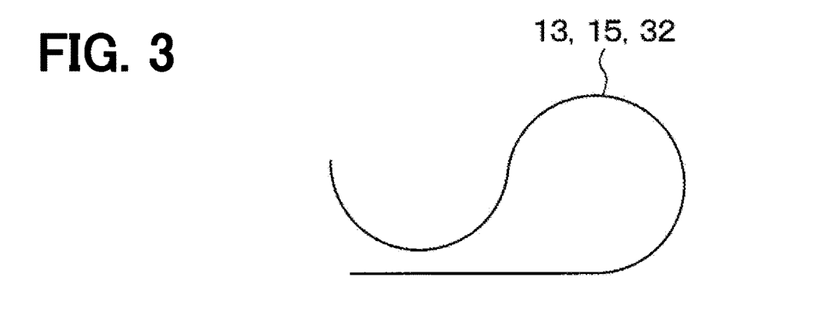
FIG. 3 is a diagram showing a configuration of a reflector.
Figure 4:
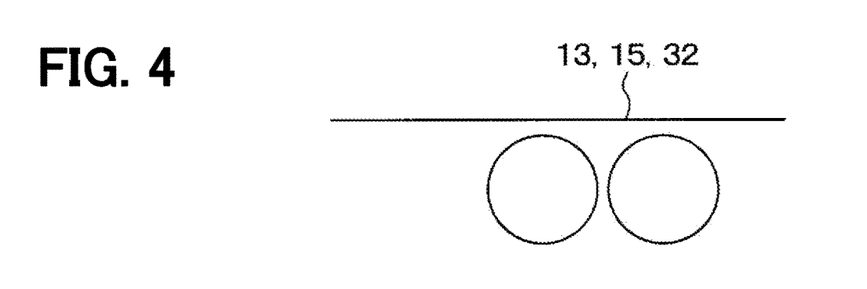
FIG. 4 is a diagram showing a configuration of a reflector.
Figure 5:
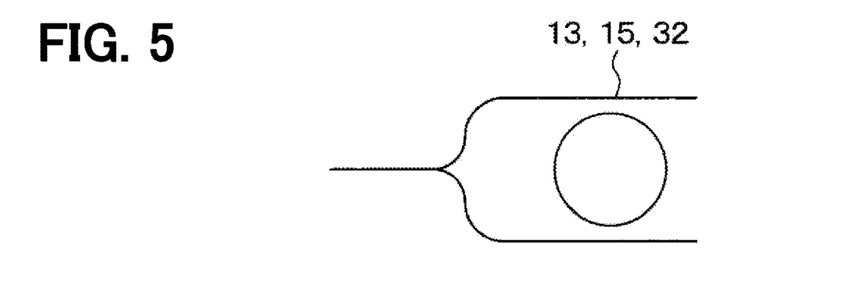
FIG. 5 is a diagram showing a configuration of a reflector.
Figure 6:
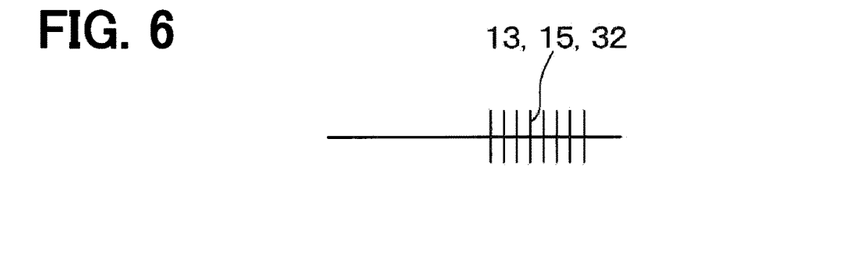
FIG. 6 is a diagram showing a configuration of a reflector.

Specifically, the resonance unit 10 includes (i) a waveguide 12 that is a bus waveguide connected to the light emitter 11, and (ii) a reflector 13 arranged adjacent to the light emitter 11 so as to reflect the light emitted by the light emitter 11 and input the reflected light to the waveguide 12. The waveguide 12 and the waveguides 14 and 31 described later each include (i) a core layer that is a part of the silicon (Si) layer of the SOI substrate formed linearly by etching, and (ii) a clad layer that includes a sacrificial layer located below the core layer, and an insulating layer formed so as to cover the core layer. The reflector 13 and the reflectors 15 and 32 described later may employ a loop mirror shown in FIG. 2, a coupler shown in FIG. 3, a ring shown in FIGS. 4 and 5, and a distributed Bragg reflector shown in FIG. 6. The waveguide 12 corresponds to a first waveguide, and the reflector 13 corresponds to a first reflector.

Also, as shown in FIG. 1, the resonance unit 10 further includes (i) a waveguide 14 arranged in a state separated from the waveguide 12, (ii) a reflector 15 connected to one end of the waveguide 14, and (iii) a ring resonator 16 arranged between the waveguide 12 and the waveguide 14. The waveguide 14 corresponds to a second waveguide, the reflector 15 corresponds to a second reflector, and the ring resonator 16 corresponds to a first ring resonator.

Further, the resonance unit 10 further includes a directional coupler 17; the waveguide 12 and the ring resonator 16 are connected by the directional coupler 17. Further, the resonance unit 10 further includes a directional coupler 18; the ring resonator 16 and the waveguide 14 are connected by the directional coupler 18.

In the resonance unit 10 having such a configuration, the light emitted by the light emitter 11 resonates between the reflector 13 and the reflector 15 by the ring resonator 16, and is outputted from the reflector 13 or the reflector 15. Further, the light outputted from the reflector 13 or the reflector 15 is blocked from the ring resonator 16; such the blocked light is partially transmitted to (i) the end of the waveguide 12 opposite to the other end that is connected to the light emitter 11 and the reflector 13 and (ii) the end of the waveguide 14 opposite to the other end that is connected to the reflector 15.

The optical negative feedback unit 30 controls the frequency of the light outputted from the resonance unit 10 by reflecting a part of the light outputted from the resonance unit 10 and inputting it to the light emitter 11. The optical negative feedback unit 30 includes (i) a waveguide 31 arranged such that the light blocked from the ring resonator 16 and transmitted to the end of the waveguide 12 is incident or inputted to the waveguide 31, and (ii) a reflector 32 connected to the waveguide 31. The optical negative feedback unit 30 is configured such that the light reflected by the reflector 32 is outputted from the waveguide 31 and inputted to the waveguide 12. The waveguide 31 corresponds to a third waveguide, and the reflector 32 corresponds to a third reflector.

In the laser light source of the present embodiment, the light emitted by the light emitter 11 is inputted from the waveguide 12 to the ring resonator 16 via the directional coupler 17. As described above, this light is resonated between the reflector 13 and the reflector 15 by the ring resonator 16, and is outputted from the reflector 13 or the reflector 15. The light outputted or reflected from the reflector 15 and blocked from the ring resonator 16 is partially transmitted to the end of the waveguide 14 opposite to the other end connected to the reflector 15. The transmitted light is then outputted to the outside of the laser light source. Further, the light outputted or reflected from the reflector 13 and blocked from the ring resonator 16 is partially transmitted to the end of the waveguide 12 opposite to the other end connected to the light emitter 11 and the reflector 13. The light, which is transmitted to the end of the waveguide 12, is inputted to the waveguide 31 and reflected from the reflector 32. The reflected light propagates through the waveguide 31 and the waveguide 12, so as to be inputted to the light emitter 11. As a result, the optical negative feedback works, the fluctuation of the frequency of the light emitted by the light emitter 11 is canceled, and the frequency is stabilized.

Figure 7:
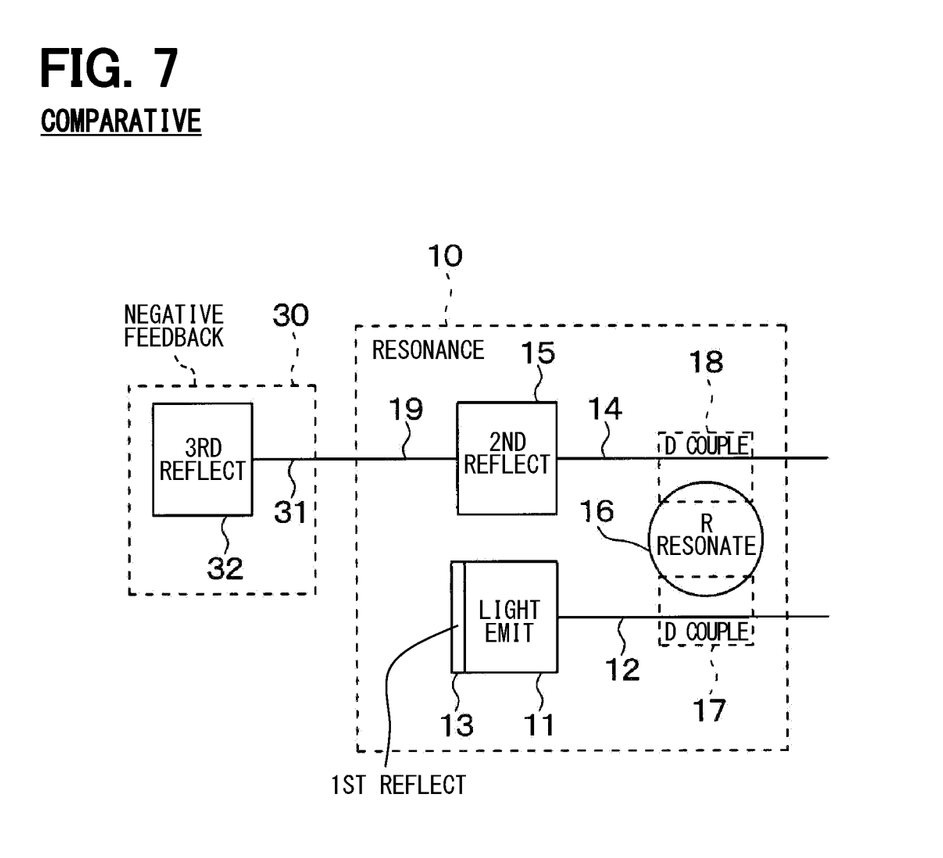
FIG. 7 is a diagram showing a configuration of a comparative example.

In a comparative example shown in FIG. 7, a reflector 15 is arranged to be sandwiched between a waveguide 19 and a waveguide 14; the light inputted to or incident on the reflector 15 is partially transmitted through the reflector 15 to be inputted to or enter the waveguide 19. Further, in this comparative example, an optical negative feedback unit 30 is arranged ahead of the waveguide 19, and the light transmitted through the reflector 15 is inputted to or incident on the waveguide 31 via the waveguide 19.

In such a configuration, the light path connecting the light emitter 11 and the optical negative feedback unit 30 becomes long. Therefore, the power loss of the light returned from the optical negative feedback unit 30 becomes large. Further, since a part of the outputted light is distributed to the optical negative feedback unit 30, the power consumption for driving the light emitter 11 increases.

On the other hand, in the present embodiment, the light emitter 11 is connected directly to an end of the waveguide 12, while the other end of the waveguide 12 is connected to the optical negative feedback unit 30. Thus, the light path connecting the light emitter 11 and the optical negative feedback unit 30 is shortened, and the power loss can be reduced. Further, the light incident on the optical negative feedback unit 30 from the waveguide 12 corresponds to the light that is discarded in the known external resonator. Therefore, by using the discarded light for the optical negative feedback, it is possible to suppress an increase in power consumption.

Second Embodiment

A second embodiment will be described. The present embodiment is similar to the first embodiment except that a ring resonator is added to the first embodiment, and therefore only parts different from the first embodiment will be described.

Figure 8:
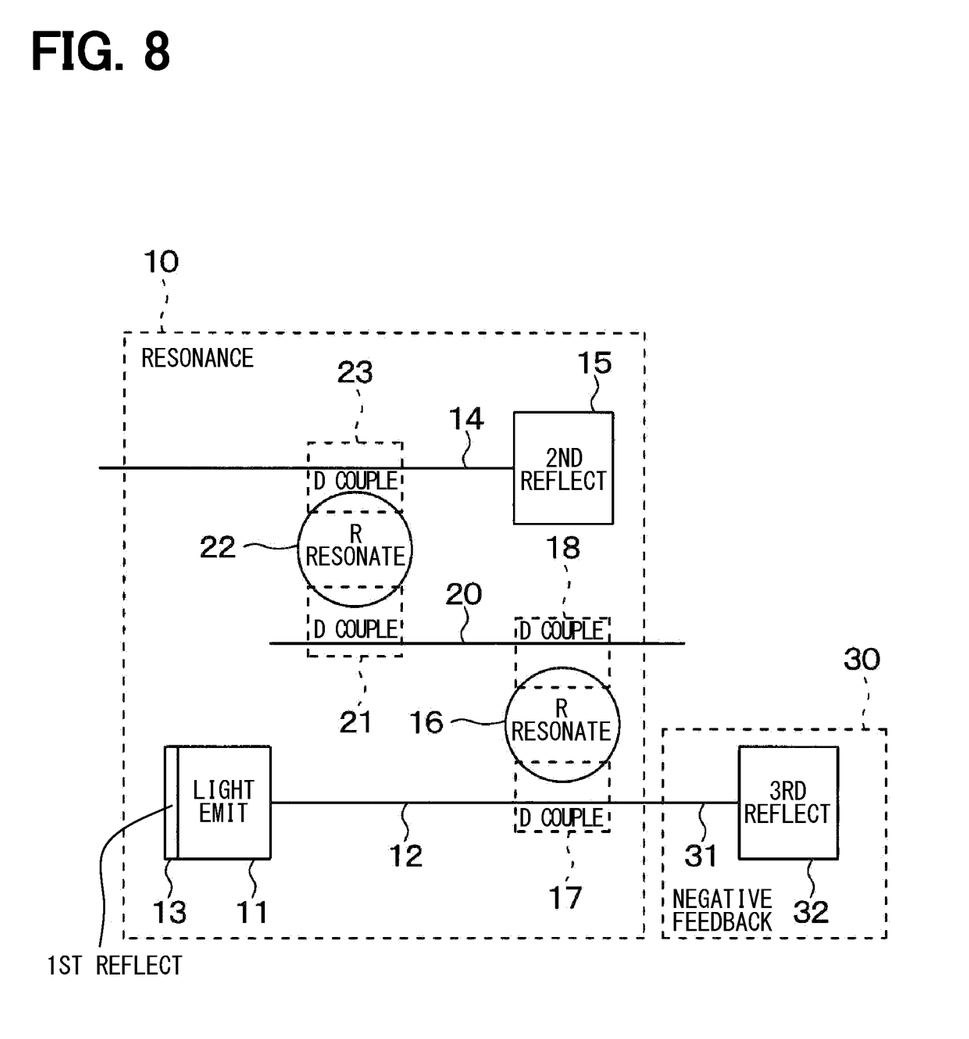
FIG. 8 is a diagram showing a configuration of a laser light source according to a second embodiment.

As shown in FIG. 8, in the resonance unit 10 according to the present embodiment, two ring resonators are arranged between the waveguide 12 and the waveguide 14; the light resonates between the reflector 13 and the reflector 15 by these two ring resonators.

That is, the resonance unit 10 further includes (i) a waveguide 20 connected to the ring resonator 16 via the directional coupler 18 and (ii) a directional coupler 21 arranged at the end of the waveguide 20. Further, the resonance unit 10 further includes (i) a ring resonator 22 connected to the waveguide 20 via the directional coupler 21 and (ii) a directional coupler 23 connecting the ring resonator 22 to the waveguide 14. Then, the light emitted by the light emitter 11 resonates between the reflector 13 and the reflector 15 by the ring resonator 16 and the ring resonator 22. The ring resonator 22 corresponds to a first ring resonator.

In the present embodiment in which the two ring resonators are arranged between the reflector 13 and the reflector 15 in this way, the same effect as in the first embodiment can be obtained.

Third Embodiment

A third embodiment will be described. The present embodiment is similar to the first embodiment except that a ring resonator is added to the first embodiment, and therefore only parts different from the first embodiment will be described.

Figure 9:
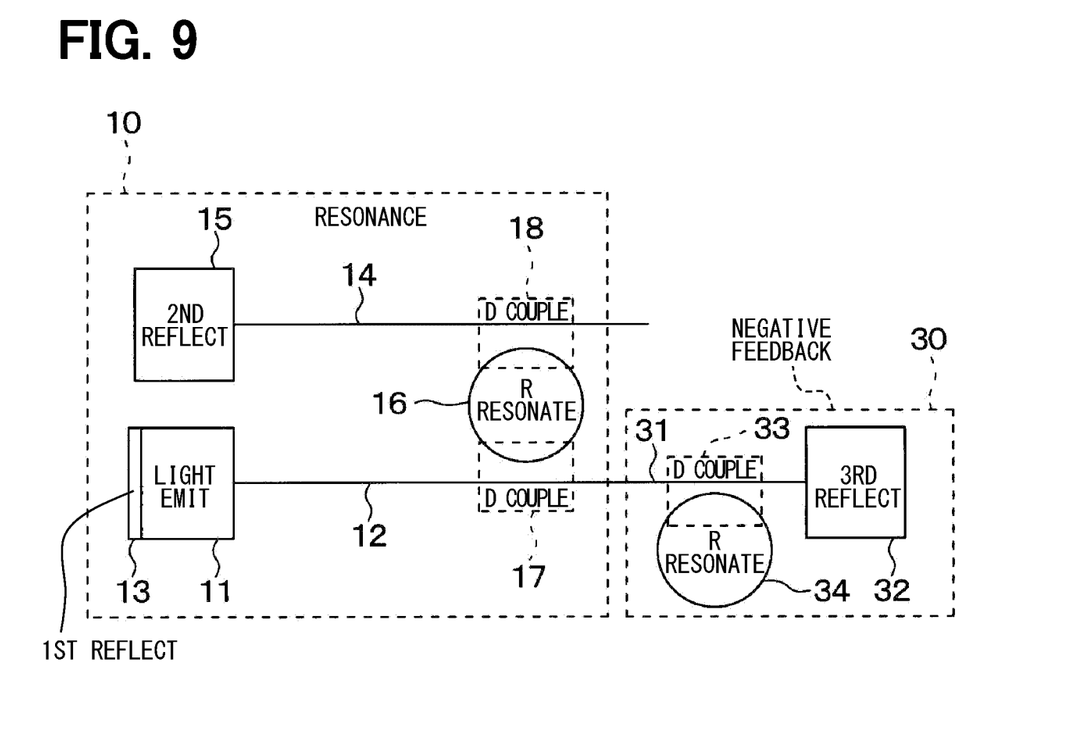
FIG. 9 is a diagram showing a configuration of a laser light source according to a third embodiment.

As shown in FIG. 9, in the present embodiment, the optical negative feedback unit 30 further includes a ring resonator 34 connected to the waveguide 31 via a directional coupler 33. The ring resonator 34 corresponds to a second ring resonator.

Figure 10:
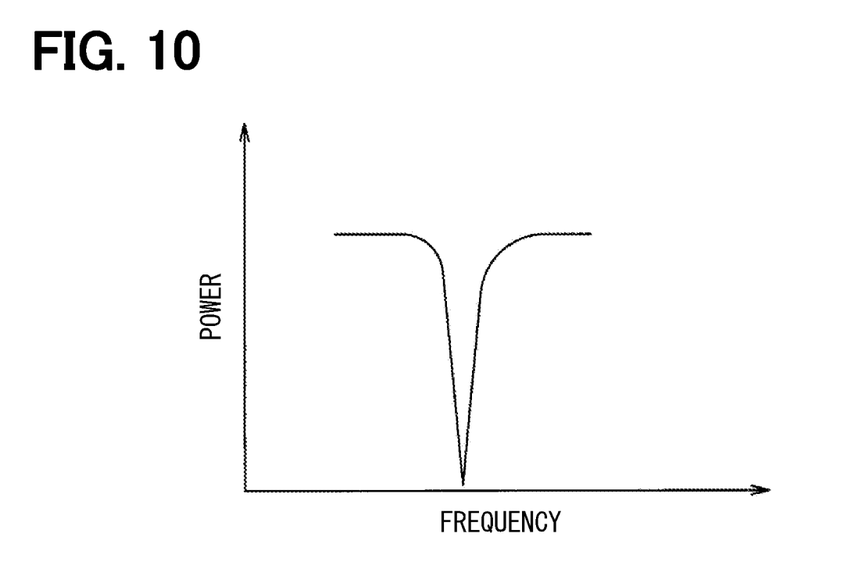
FIG. 10 is a diagram showing a relationship between the frequency of return light and power.

In this way, the power of the light returned from the optical negative feedback unit 30 drops at a certain frequency, as shown in FIG. 10. This frequency is adjusted by changing the temperature of the reflector 32 with a heater or the like (not shown).

Suppose a case where the frequency at which the power of the returned light drops is adjusted or matched to the desired frequency of the light emitted by the light emitter 11. In this case, when the light is outputted at the desired frequency, the power of the returned light becomes smaller. Therefore, the change in frequency due to optical negative feedback becomes small. When the frequency of the light emitted by the light emitter 11 is different or separate from the desired frequency, the power of the returned light is increased, so that the frequency change due to the optical negative feedback is large. This facilitates frequency control and facilitates the design of the laser light source.

Fourth Embodiment

A fourth embodiment will be described. The present embodiment is similar to the first embodiment except that a ring resonator is added to the first embodiment, and therefore only parts different from the first embodiment will be described.

Figure 11:
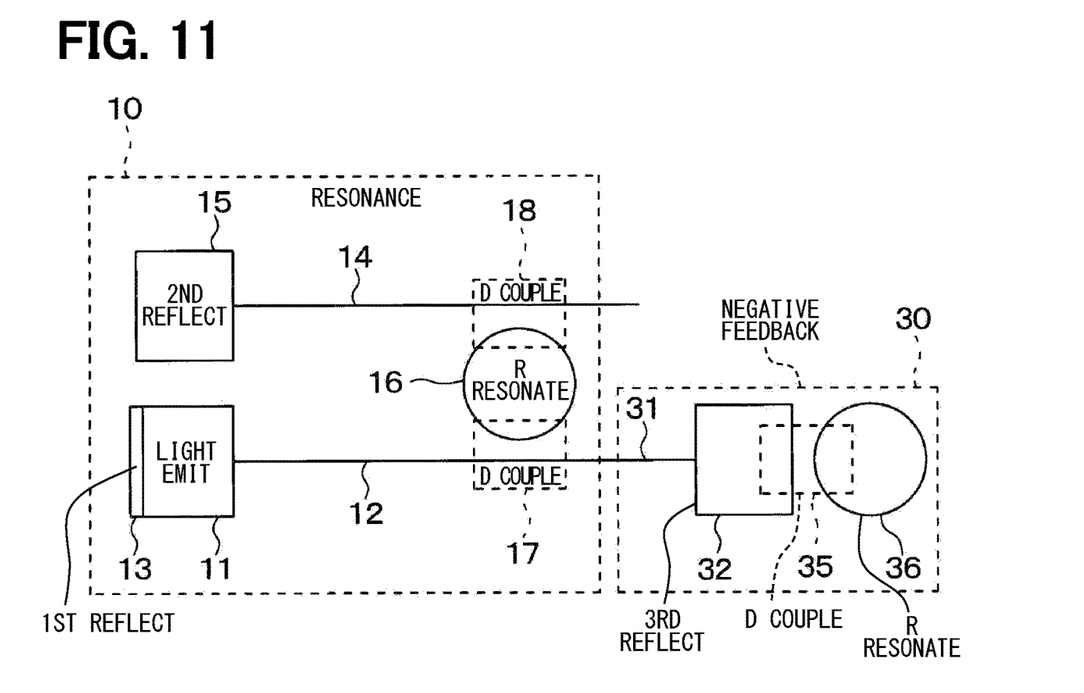
FIG. 11 is a diagram showing a configuration of a laser light source according to a fourth embodiment.

As shown in FIG. 11, in the present embodiment, the optical negative feedback unit 30 further includes a ring resonator 36 connected to the reflector 32 via a directional coupler 35. The ring resonator 36 corresponds to a second ring resonator.

In this way, the power of the returned light from the optical negative feedback unit 30 drops, as in the third embodiment. Then, by adjusting the frequency at which the power drops to a desired frequency, the frequency can be easily controlled and the design of the laser light source becomes easy.

Fifth Embodiment

A fifth embodiment will be described. The present embodiment is different from the first embodiment in the configuration of the waveguide and the other configurations are similar to the first embodiment, so only the difference from the first embodiment will be described.

Figure 12:
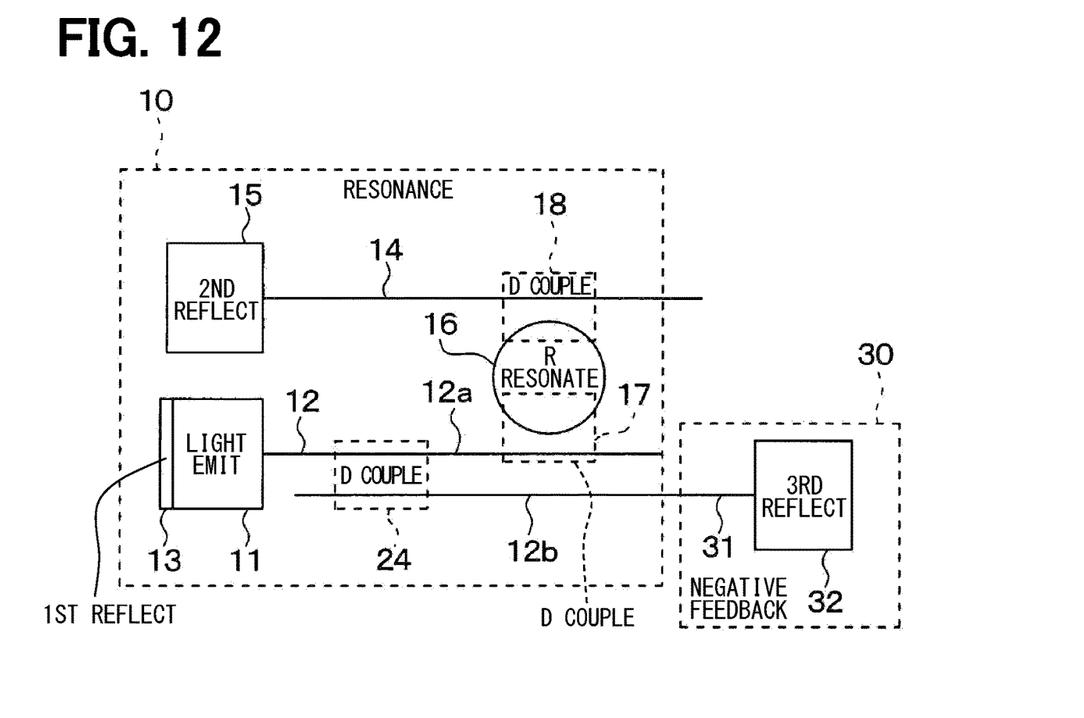
FIG. 12 is a diagram showing a configuration of a laser light source according to a fifth embodiment.

As shown in FIG. 12, in the present embodiment, the waveguide 12 is branched into two branched waveguides 12a and 12b by using a directional coupler 24. Then, the branched waveguide 12a is connected to the ring resonator 16 by the directional coupler 17 as in the waveguide 12 of the first embodiment. The light outputted from the reflector 13 and blocked from the ring resonator 16 is partially outputted from the end of the waveguide 12a opposite to the other end connected to the light emitter 11 and the reflector 13. Further, the light outputted from the reflector 13 and inputted to the branched waveguide 12b is transmitted to the end of the waveguide 12b and inputted to the waveguide 31.

In such a configuration, the power of light assigned to the optical negative feedback unit 30 can be adjusted by designing the directional coupler 24.

Sixth Embodiment

A sixth embodiment will be described. The present embodiment is similar to the fourth embodiment except that a light detector is added to the fourth embodiment, and therefore only parts different from the fourth embodiment will be described.

Figure 13:
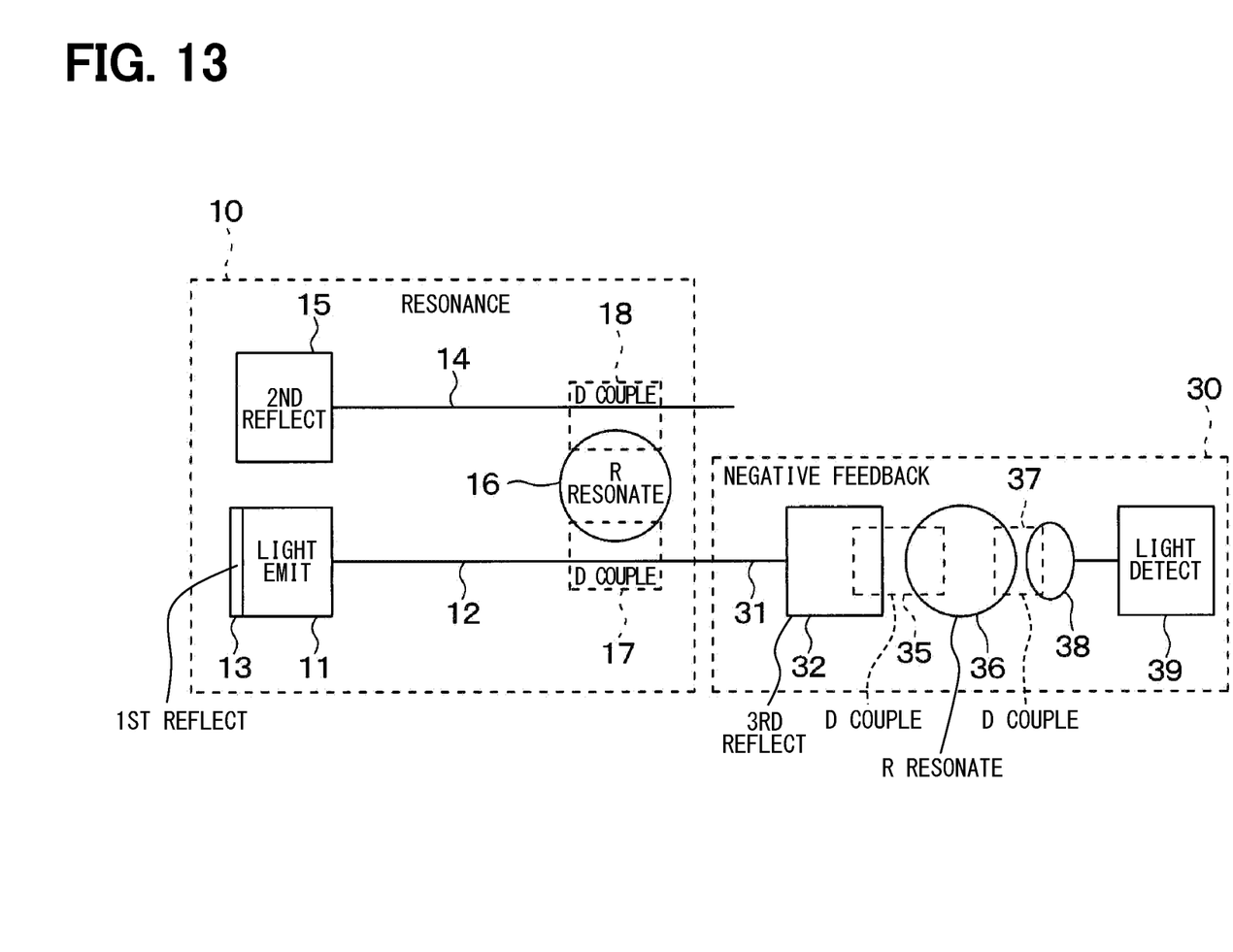
FIG. 13 is a diagram showing a configuration of a laser light source according to a sixth embodiment.

As shown in FIG. 13, in the present embodiment, the optical negative feedback unit 30 further includes (i) a waveguide 38 connected to the ring resonator 36 via a directional coupler 37, and (ii) a light detector 39 connected to the waveguide 38.

In such a configuration, the light is designed to be inputted from the ring resonator 36 to the light detector 39 via the directional coupler 37 and the waveguide 38 only when the light of a desired frequency is output. This facilitates control of the frequency of the light emitted by the light emitter 11.

Seventh Embodiment

A seventh embodiment will be described. The present embodiment is similar to the first embodiment except that a light phase modulator is added to the first embodiment, and therefore only the parts different from the first embodiment will be described.

Figure 14:
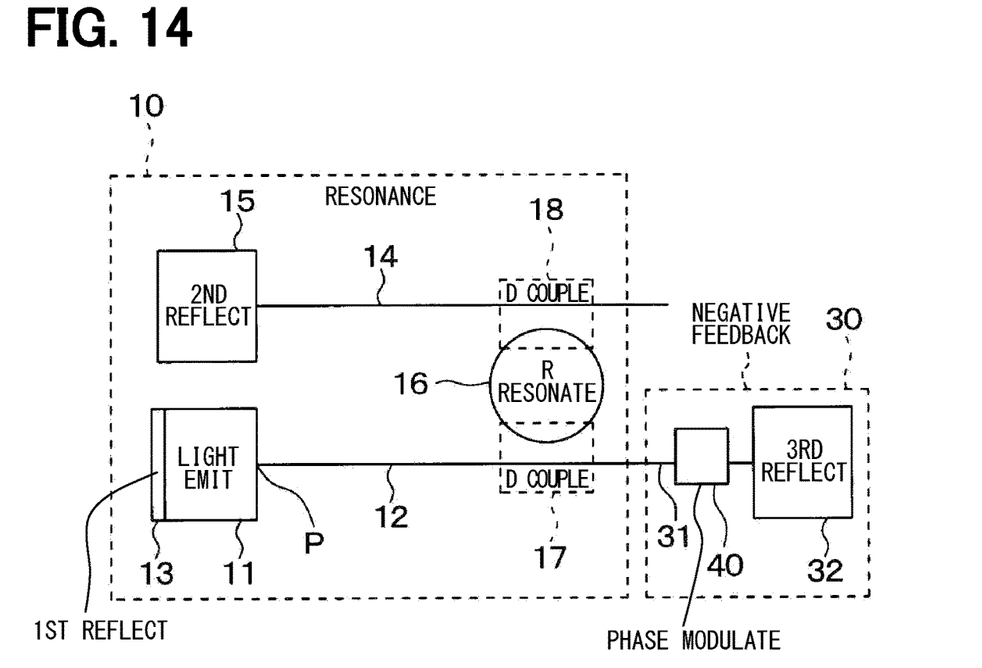
FIG. 14 is a diagram showing a configuration of a laser light source according to a seventh embodiment.

As shown in FIG. 14, in the present embodiment, a light phase modulator 40 that modulates the phase of the light returned from the optical negative feedback unit 30 is arranged on the waveguide 31 in the optical negative feedback unit 30.

In a laser light source using optical negative feedback, the effect of the optical negative feedback increases when the phase difference between the light inputted to the optical negative feedback unit 30 and the light returned from the optical negative feedback unit 30 to the light emitter 11 is $-\pi/2$, or $\pi$, or between $-\pi/2$ and $\pi$. Therefore, the light phase modulator 40 is arranged in this way to adjust the phase of the return light. This makes it possible to increase the effect of optical negative feedback and facilitate the control of the frequency of the light emitted by the light emitter 11.

The phase difference between the above two lights may be measured, for example, at the position indicated by the point P in FIG. 14, that is, at the connection point between the light emitter 11 and the waveguide 12.

Eighth Embodiment

An eighth embodiment will be described. The present embodiment is similar to the first embodiment except that a frequency modulator is added to the first embodiment, and therefore only parts different from the first embodiment will be described.

Figure 15:
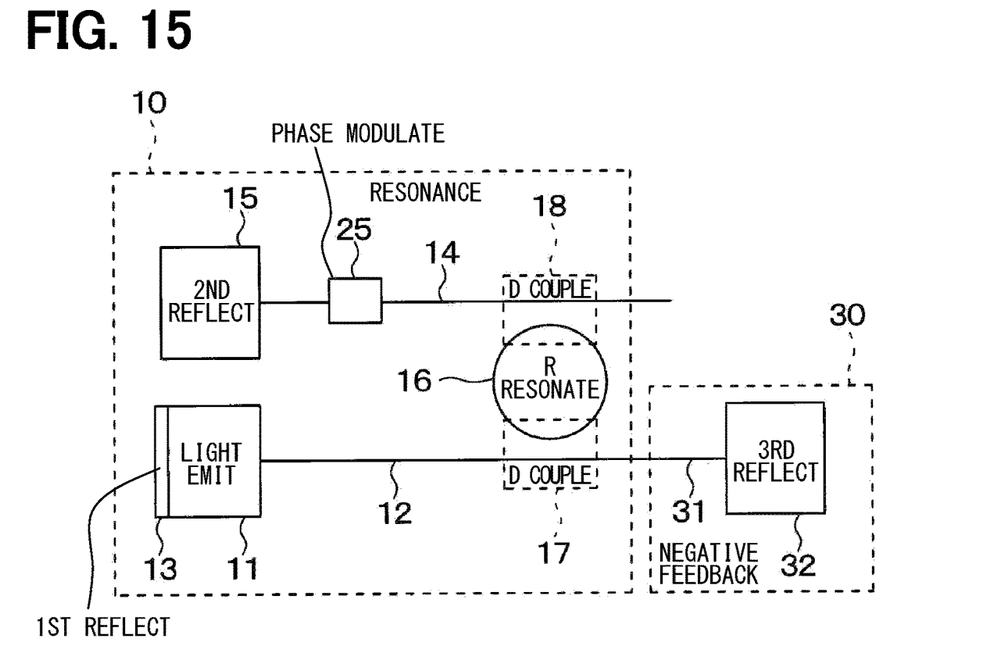
FIG. 15 is a diagram showing a configuration of a laser light source according to an eighth embodiment.

As shown in FIG. 15, in the present embodiment, The resonance unit 10 further includes a frequency modulator 25 that modulates the frequency of light returned from the reflector 15 to the light emitter 11. The frequency modulator 25 is arranged on the waveguide 14.

When the laser light source includes the frequency modulator 25, the frequency modulator 25 is arranged at a location away from the path connecting the light emitter 11 and the reflector 32. As a result, the power loss can be reduced as compared with the case where the frequency modulator 25 is arranged on this path.

Other Embodiments

The present disclosure is not limited to the above-described embodiments and may be appropriately modified.

For example, in the third to eighth embodiments, the resonance unit 10 may include a ring resonator 22. Further, the resonance unit 10 may include three or more ring resonators on the path connecting the reflector 13 and the reflector 15. Further, in the fourth to eighth embodiments, the optical negative feedback unit 30 may include a ring resonator 34. Further, in the fifth, seventh, and eighth embodiments, the optical negative feedback unit 30 may include a ring resonator 36. Further, in the sixth to eighth embodiments, the waveguide 12 may be branched. Further, in the seventh and eighth embodiments, the optical negative feedback unit 30 may include a ring resonator 36 and a light detector 39. Further, the light detector 39 may be connected to the ring resonator 34. Further, in the eighth embodiment, the laser light source may include a light phase modulator 40.

Further, in the seventh embodiment, the light phase modulator 40 is arranged on the optical negative feedback unit 30. However, the light phase modulator 40 may be arranged in another place in the waveguide 12 or the waveguide 31 as long as it is away from the path connecting the reflector 13 and the reflector 15. For example, in the resonance unit 10, the light phase modulator 40 may be arranged between (i) the end of the waveguide 12 at which the light is outputted to the optical negative feedback unit 30 and (ii) the directional coupler 17.

For reference to further explain features of the present disclosure, the description is added as follows.

There are proposed various methods for narrowing the spectral line width of a laser light source. For example, in a laser light source having an external resonator structure that provides a resonator outside the light emitter, a method of narrowing the line by extending the length of the resonator has been proposed. However, if the length of the resonator is extended, it becomes difficult to adjust the oscillation frequency as the line is narrowed, and the frequency modulation range becomes narrow. Further, a method has been proposed in which the phase of the outputted light is adjusted by an electric feedback technique to cancel the fluctuation and lower the line width coefficient to narrow the line. However, the effect of narrowing the line is limited only by lowering the line width coefficient.

On the other hand, in a laser light source using optical negative feedback that cancels fluctuations with light, it is possible to extend the length of the resonator and reduce the line width coefficient. This configuration can provide an effect of narrowing the line that is greater than that of the above laser light source. For example, there is proposed a laser light source that includes a gain medium that generates light, a resonator placed outside the gain medium, two reflectors located at both ends of the path through the gain medium and resonator, and an optical negative feedback unit connected to one of the reflectors.

In the laser light source described above, the resonator is sandwiched between the reflector and the gain medium, and the optical negative feedback unit is connected to the outside of the reflector opposite to the gain medium. Therefore, the path connecting the gain medium and the optical negative feedback unit is long, and the power loss of the light returned from the optical negative feedback unit is large.

It is thus desired to provide a laser light source capable of reducing power loss.

Aspects of the present disclosure described herein are set forth in the following clauses.

According to a first aspect of the present disclosure, a laser light source includes: a resonance unit including a light emitter configured to emit light, to resonate the light emitted by the light emitter and output the light; and an optical negative feedback unit configured to control a frequency of the light outputted from the resonance unit by reflecting partially the light outputted from the resonance unit and inputting the reflected light to the light emitter. The resonance unit includes: a first waveguide connected to the light emitter; a first reflector configured to reflect the light emitted by the light emitter and input the reflected light to the first waveguide; a second waveguide arranged separate from the first waveguide; a second reflector connected to the second waveguide; and a ring resonator arranged between the first waveguide and the second waveguide. Herein, the light emitted by the light emitter resonates between the first reflector and the second reflector by the ring resonator; the light reflected from the first reflector is blocked from the ring resonator and partially transmitted to a first end of the first waveguide opposite to a second end of the first waveguide connected to the light emitter and the first reflector; the light reflected from the second reflector is blocked from the ring resonator and partially transmitted to a first end of the second waveguide opposite to a second end of the second waveguide connected to the second reflector. Further, the optical negative feedback unit includes: a third waveguide arranged such that the light blocked from the ring resonator is transmitted to the first end of the first waveguide and inputted to the third waveguide; and a third reflector connected to the third waveguide. Herein, the light reflected from the third reflector is outputted from the third waveguide and inputted to the first waveguide.

In the configuration according to the first aspect, the light emitter is connected directly to one end of the first waveguide, and the optical negative feedback unit is connected to the other one end of the first waveguide. Thus, the light transmitted from the one end to the other one end of the first waveguide is inputted to the optical negative feedback unit. Therefore, the path connecting the light emitter and the optical negative feedback unit is shortened, and the power loss can be reduced.

According to a second aspect of the present disclosure, a laser light source includes: a resonance unit including a light emitter configured to emit light, to resonate the light emitted by the light emitter and output the light; and an optical negative feedback unit configured to control a frequency of the light outputted from the resonance unit by reflecting partially the light outputted from the resonance unit and inputting the reflected light to the light emitter. The resonance unit includes: a first waveguide connected to the light emitter; a directional coupler configured to branch the first waveguide into two branched waveguides being a first branched waveguide and a second branched waveguide; a first reflector configured to reflect the light emitted by the light emitter and input the reflected light to the first waveguide; a second waveguide arranged separate from the first waveguide; a second reflector connected to the second waveguide; and a ring resonator arranged between (i) the first branched waveguide of the first waveguide branched by the directional coupler and (ii) the second waveguide. Herein, the light emitted by the light emitter resonates between the first reflector and the second reflector by the ring resonator; the light reflected from the first reflector is blocked from the ring resonator and partially outputted from a first end of the first branched waveguide of the first waveguide opposite to a second end of the first branched waveguide connected to the light emitter and the first reflector; the light reflected from the second reflector is blocked from the ring resonator and partially outputted from a first end of the second waveguide opposite to a second end of the second waveguide connected to the second reflector; the light reflected from the first reflector is inputted to the second branched waveguide of the first waveguide and transmitted to an end of the second branched waveguide of the first waveguide. Further, the optical negative feedback unit includes: a third waveguide arranged such that the light transmitted to the end of the second branched waveguide of the first waveguide is inputted to the third waveguide; and a third reflector connected to the third waveguide. Herein, the light reflected from the third reflector is outputted from the third waveguide and inputted to the first waveguide.

In the configuration according to the second aspect, the first waveguide directly connected to the light emitter is branched into two branched waveguides by a directional coupler. One of the two branched waveguides is connected to a ring resonator; the light branched to the other one of the two branched waveguides is inputted to the optical negative feedback unit. Therefore, the path connecting the light emitter and the negative light feedback unit is shortened, and the power loss can be reduced.

What is claimed is:

1. A laser light source comprising:
    a resonance unit including a light emitter configured to emit light, the resonance unit being configured to resonate the light emitted by the light emitter and output the light; and
    an optical negative feedback unit configured to control a frequency of the light outputted from the resonance unit by reflecting partially the light outputted from the resonance unit and inputting the reflected light to the light emitter,
    wherein the resonance unit comprises:
        a first waveguide connected to the light emitter;
        a first reflector configured to reflect the light emitted by the light emitter and input the reflected light to the first waveguide;
        a second waveguide arranged separate from the first waveguide;
        a second reflector connected to an end portion of the second waveguide; and
        a ring resonator arranged between the first waveguide and the second waveguide,
    wherein the light emitted by the light emitter resonates between the first reflector and the second reflector by the ring resonator,
    wherein the light reflected from the first reflector is blocked from the ring resonator and partially transmitted to a first end of the first waveguide opposite to a second end of the first waveguide connected to the light emitter and the first reflector,
    wherein the light reflected from the second reflector is blocked from the ring resonator and partially transmitted to a first end of the second waveguide opposite to a second end of the second waveguide connected to the second reflector,
    wherein the optical negative feedback unit comprises:
        a third waveguide arranged such that the light blocked from the ring resonator is transmitted to the first end of the first waveguide and inputted to the third waveguide; and
        a third reflector connected to the third waveguide,
    wherein the light reflected from the third reflector is outputted from the third waveguide and directly inputted to the first waveguide.

2. The laser light source according to claim 1, wherein:
    the optical negative feedback unit further comprises a different ring resonator connected to the third waveguide.

3. The laser light source according to claim 1, wherein:
    the optical negative feedback unit comprises a different ring resonator connected to the third reflector.

4. The laser light source according to claim 2, wherein:
    the optical negative feedback unit comprises a light detector connected to the different ring resonator.

5. The laser light source according to claim 1, further comprising:
    a light phase modulator arranged at a location in either the first waveguide or the third waveguide to be separate from a path connecting the first reflector and the second reflector, the light phase modulator being configured to modulate a phase of the light returned from the optical negative feedback unit.

6. The laser light source according to claim 1, further comprising:
    a frequency modulator arranged at a location separate from a path connecting the light emitter and the third reflector, the frequency modulator being configured to modulate a frequency of the light returned from the second reflector to the light emitter.

7. The laser light source according to claim 1, wherein:
    a phase difference between (i) the light inputted to the optical negative feedback unit and (ii) the light returned from the optical negative feedback unit to the light emitter is equal to $-\pi/2$, or equal to $\pi$, or between $-\pi/2$ and $\pi$.

8. A laser light source comprising:
    a resonance circuit including a light emitter configured to emit light, the resonance circuit being configured to resonate the light emitted by the light emitter and output the light; and
    an optical negative feedback circuit configured to control a frequency of the light outputted from the resonance circuit by reflecting partially the light outputted from the resonance circuit and inputting the reflected light to the light emitter,
    wherein the resonance circuit comprises:
        a first waveguide connected to the light emitter;
        a first reflector configured to reflect the light emitted by the light emitter and input the reflected light to the first waveguide;
        a second waveguide arranged separate from the first waveguide;
        a second reflector connected to an end portion of the second waveguide; and
        a ring resonator arranged between the first waveguide and the second waveguide,
    wherein the light emitted by the light emitter resonates between the first reflector and the second reflector by the ring resonator,
    wherein the light reflected from the first reflector is blocked from the ring resonator and partially transmitted to a first end of the first waveguide opposite to a second end of the first waveguide connected to the light emitter and the first reflector,
    wherein the light reflected from the second reflector is blocked from the ring resonator and partially transmitted to a first end of the second waveguide opposite to a second end of the second waveguide connected to the second reflector, wherein the optical negative feedback circuit comprises:
a third waveguide arranged such that the light blocked from the ring resonator is transmitted to the first end of the first waveguide and inputted to the third waveguide; and
a third reflector connected to the third waveguide,
wherein the light reflected from the third reflector is outputted from the third waveguide and directly inputted to the first waveguide.

9. The laser light source according to claim 8,
wherein the resonance circuit further comprises:
a directional coupler configured to branch the first waveguide into two branched waveguides being a first branched waveguide and a second branched waveguide, the ring resonator being arranged between (i) the first branched waveguide of the first waveguide branched by the directional coupler and (ii) the second waveguide,
wherein the light reflected from the first reflector is blocked from the ring resonator and partially outputted from a first end of the first branched waveguide of the first waveguide opposite to a second end of the first branched waveguide connected to the light emitter and the first reflector,
wherein the light reflected from the second reflector is blocked from the ring resonator and partially outputted from the first end of the second waveguide opposite to the second end of the second waveguide connected to the second reflector,
wherein the light reflected from the first reflector is inputted to the second branched waveguide of the first waveguide and transmitted to an end of the second branched waveguide of the first waveguide,
wherein in the optical negative feedback circuit, the third waveguide is arranged such that the light transmitted to the end of the second branched waveguide of the first waveguide is inputted to the third waveguide,
wherein the light reflected from the third reflector is outputted from the third waveguide and inputted to the first waveguide.

10. The laser light source according to claim 8, wherein:
the optical negative feedback circuit further comprises a different ring resonator connected to the third waveguide.

11. The laser light source according to claim 8, wherein:
the optical negative feedback circuit comprises a different ring resonator connected to the third reflector.

12. The laser light source according to claim 10, wherein:
the optical negative feedback circuit comprises a light detector connected to the different ring resonator.

13. The laser light source according to claim 8, further comprising:
a light phase modulator arranged at a location in either the first waveguide or the third waveguide to be separate from a path connecting the first reflector and the second reflector, the light phase modulator being configured to modulate a phase of the light returned from the optical negative feedback circuit.

14. The laser light source according to claim 8, further comprising:
a frequency modulator arranged at a location separate from a path connecting the light emitter and the third reflector, the frequency modulator being configured to modulate a frequency of the light returned from the second reflector to the light emitter.

15. The laser light source according to claim 8, wherein:
a phase difference between (i) the light inputted to the optical negative feedback circuit and (ii) the light returned from the optical negative feedback circuit to the light emitter is equal to $-\pi/2$, or equal to $\pi$, or between $-\pi/2$ and $\pi$.

16. The laser light source according to claim 1, wherein:
the resonance unit includes a first directional coupler connected to the first waveguide and the ring resonator and a second directional coupler connected to the second waveguide and the ring resonator.

17. The laser light source according to claim 8, wherein:
the resonance unit includes a first directional coupler connected to the first waveguide and the ring resonator and a second directional coupler connected to the second waveguide and the ring resonator.

* * * * *